United States Patent [19]

Ide et al.

[11] Patent Number: 5,781,391

[45] Date of Patent: Jul. 14, 1998

[54] IC HAVING BUILT-IN OVER VOLTAGE PROTECTING CIRCUIT

[75] Inventors: Yuzo Ide; Koichi Inoue, both of Ukyo-ku, Japan

[73] Assignee: Rohm co., Ltd., Kyoto, Japan

[21] Appl. No.: 799,840

[22] Filed: Feb. 13, 1997

[30] Foreign Application Priority Data

Feb. 14, 1996 [JP] Japan .................................. 8-050874

[51] Int. Cl.$^6$ .................................................. H02H 3/20
[52] U.S. Cl. ................................................ 361/91; 361/18
[58] Field of Search ........................... 257/358, 363; 361/18, 54, 56, 91, 88, 93, 78, 86

[56] References Cited

U.S. PATENT DOCUMENTS 5,072,271   12/1991   Shimizu et al. ...................... 257/358

*Primary Examiner*—Ronald W. Leja

*Attorney, Agent, or Firm*—Fay, Sharpe, Beall, Fagan, Minnich & McKee

[57] ABSTRACT

An IC having a built-in over voltage protecting circuit comprising: a first operating circuit having a first resistor connected to a terminal the voltage at which varies depending on a voltage at a first terminal; a second operating circuit; a protecting circuit having a second resistor, which receives a detection signal via the second resistor and controls the operation of the second operating circuit therewith to thereby protect the operation of the second operating circuit, wherein the first resistor and the second resistor are formed adjacently in a device-isolated common resistor forming land as regions having different conductivity type from that of the resistor forming land, the potential of the resistor forming land is set at a predetermined voltage which is different from the voltage at the first terminal, and the detection signal is generated, when a transistor which is composed by the first resistor, the second resistor and the resistor forming land is turned ON in response to a variation of the voltage at the first terminal by a value more than a predetermined value.

8 Claims, 3 Drawing Sheets

5,781,391

1

IC HAVING BUILT-IN OVER VOLTAGE PROTECTING CIRCUIT

BACKGROUND OF THE INVENTION

1. Field of the Invention

The present invetion relates to an IC having a built-in over voltage protecting circuit and, more specifically, relates to an IC having an over voltage protecting circuit such as in an IC structured stabilizing power source circuit which is permitted to detect an over voltage with a simple circuit.

2. Background Art

FIG. 4 shows a conventional IC structured stabilizing power source circuit having an output over voltage protecting circuit.

Numeral 1 is a reference voltage source which generates a reference voltage Vr, numeral 2 is an output voltage detecting circuit which divides an output voltage Vo at an output terminal 6 with resistors Ra and Rb and generates a detection voltage Vf and numeral 3 is an error amplifying circuit which amplifies an error between the reference voltage Vr and the detection voltage Vf and outputs the same. In other words, the error amplifying circuit 3 generates an error signal which represents a deviation of the output voltage Vo from a constant control target value (Vr×(Ra+Rb)/Rb).

A transistor Q1 is a PNP type power transistor which drops a power source voltage Vcc depending on an output from the error amplifying circuit 3 and generates a regulated output voltage Vo. Thereby, the amount of voltage drop (Vcc−Vo) from the power source line voltage Vcc (hereinbelow called as power source voltage Vcc) to the output voltage Vo is controlled so that the reference voltage Vr coincides with the detection voltage Vf (=Vo×Rb/(Ra+Rb)) depending on the error signal and the output voltage Vo is always regulated to assume the constant control target value (Vr×(Ra+Rb)/Rb).

Further, a transistor Q9 is one which receives the error signal from the error amplifying circuit 3 at the base thereof and drives the output transistor Q1.

With the above explained circuit the output voltage Vo is stabilized substantially at a constant voltage, even when, for example, the power source line voltage Vcc varies or the load which is applied of the output voltage Vo varies.

Numeral 4 is a saturation preventing circuit provided in this stabilizing power source circuit and numeral 5 is an output over voltage protecting circuit also provided in the stabilizing power source circuit. The saturation preventing circuit 4 detects a voltage difference between the power source voltage Vcc and the output voltage Vo and performs a control for suppressing the output current from the error amplifying circuit 3 when the detected voltage difference decreases below a predetermined value so as to prevent saturation of the output transistor Q1.

The output over voltage protecting circuit 5 performs a control for stopping the operation of the error amplifying circuit 3 so as to prevent a circuit breakdown due to current backflow from the load side to the output terminal 6 when the output voltage Vo exceeds the power source voltage Vcc by a predetermined value.

The saturation preventing circuit 4 is now explained briefly. The saturation preventing circuit 4 includes a PNP type transistor Q2 and a current mirror circuit 7 constituted by NPN type transistors Q3 and Q4 disposed downstream the PNP type transistor Q2 and both connected between the output terminal 6 and the ground GND, and these circuit

2 portions function as a control circuit for the saturation preventing circuit 4. The saturation preventing circuit 4 further includes a series circuit constituted by a diode D1 and a resistor R1 which is disposed between the power source line Vcc and the base of the transistor Q2 and serves as a base biasing circuit for the transistor Q2, and downstream the series circuit and between the ground a bias current generating circuit 8 is provided.

The bias current generating circuit 8 is constituted by a current source 8a, a current mirror circuit 8b and a PNP type transistor Q7 which branches the current from the current source 8a. The current mirror circuit 8b receives the current from the current source 8a at an input side NPN type transistor Q5 and generates a sink current corresponding to the received current at an output side NPN type transistor Q6 in a current mirror connection with the NPN type transistor Q5. The output thereof is applied to the base of the transistor Q2 via the collector of the transistor Q6 to thereby cause to sink the above mentioned base biasing current. Under this condition the transistor Q2 is kept in an OFF condition.

Further, in order to increase a flow-out current from the base of the transistor Q2 in response to an increase of the output voltage value Vo at the output terminal 6 the emitter of the transistor Q7 is connected to the collector of the input side transistor Q5 in the current mirror circuit 8b. With this connection a part of the current of the current source 8a is in advance branched to the ground GND via the collector-emitter of the transistor Q7 and the amount of branching current is decreased depending on the output voltage value Vo to increase the current value for the transistor Q5. As a result, when the output voltage Vo increases by a value more than the predetermined value, the sink current through the transistor Q6 is increased to thereby increase the flow-out current value from the base of the transistor Q2. Thus the transistor Q2 is turned ON. Further, the increase of the output voltage value Vo at the output terminal 6 also increases the emitter potential of the transistor Q2 which likely serves to turn ON the transistor Q2.

When the transistor Q2 is turned ON, the output side transistor Q4 in the current mirror circuit 7 is turned ON to generate a sink current to the ground GND. Further, depending on the ON condition of these transistors Q2 and Q4 the amount of the sink current increases. Since the collector of the transistor Q4 is connected to the base of a transistor Q9, the amount of current which is sinked through the transistor Q4 corresponds to all or part of the output of the error amplifying circuit 3.

Further, the emitters of the transistors Q3 through Q6 are respectively grounded and the base of the transistor Q7 is connected to the output terminal 6.

When a voltage between the output voltage Vo and the power source voltage decrease less than a predetermined value with reference to the power source voltage Vcc, the transistor Q2 and the transistor Q4 in the current mirror circuit 7 are turned ON so as to suppress or interrupt the output of the error amplifying circuit 3. Thereby, the operation of the error amplifying circuit 3 is suppressed or stopped so that the saturation in the operation of the output transistor Q1 is prevented.

Now, the output over voltage protecting circuit 5 is explained. The output over voltage protecting circuit 5 is composed of a dividing circuit which divides the voltage Vo at the output terminal 6 with resistors R3 and R4, a comparator 9 and an NPN type transistor Q8 at the base of which the output of the comparator 9 is received via a resistor R2.

The comparator 9 receives at the reference input side thereof a reference voltage $V_{REF}$ from a comparison reference power source $V_{REF}$, compares the same with the divided input voltage from the dividing circuit and, when the output voltage Vo exceeds the power source voltage Vcc by a predetermined value, turns ON the transistor Q8. When the transistor Q8 is turned ON, the curent from the current source 3a in the error amplifying circuit 3 sinks into the ground GND and the operation of the error amplifying circuit 3 is stopped. Thereby, a possible breakdown of the stabilizing power source circuit is prevented which may be caused when the voltage (output voltage) at the load side rises by a value more than a predetermined value.

Other than the above explained output over voltage protecting circuit another over voltage protecting circuit, in that a power source over voltage protecting circuit is included which detects an over voltage of the power source itself and protects the circuit at the load side.

The power source over voltage protecting circuit is a circuit in which a comparator like the comparator 9 is inputted of a detection signal from the power source voltage detection circuit (not shown) and thereby the transistor Q8 or a like transistor is turned ON. Except for the detection of the power source voltage, the power source over voltage protecting circuit is substantially the same as the output over voltage protecting circuit, the detailed explanation thereof is omitted.

In view of improving reliability an IC structured circuit is frequently provided with both output over voltage protecting circuit and power source over voltage protecting circuit. Moreover, these sorts of over voltage protecting circuits are provided as protecting circuits not only for the above mentioned stabilizing power source circuit but also for many IC structured circuits. Accordingly, the more these sorts of protecting circuits are provided, the more the integration area is occupied by the over voltage protecting circuits to thereby decrease the integration area used for the initially intended operation in an IC.

SUMMARY OF THE INVENTION

An object of the present invention is to resolve the above mentioned conventional problems and to provide an IC having a built-in over voltage protecting circuit in which the number of elements for over voltage protecting circuits is reduced and the integration area for the over voltage protecting circuits therein is limited.

An IC having a built-in over voltage protecting circuit according to the present invention which achieves the above object, is characterized, in that, a first operating circuit having a first resistor connected to a terminal the voltage at which varies depending on a voltage at a first terminal; a second operating circuit; a protecting circuit having a second resistor, which receives a detection signal via the second resistor and controls the operation of the second operating circuit therewith to thereby protect the operation of the second operating circuit, wherein the first resistor and the second resistor are formed adjacently in a device-isolated common resistor forming land as regions having different conductivity type from that of the resistor forming land, the potential of the resistor forming land is set at a predetermined voltage which is different from the voltage at the first terminal, and the detection signal is generated, when a transistor which is composed by the first resistor, the second resistor and the resistor forming land is turned ON in response to a variation of the voltage at the first terminal by a value more than a predetermined value.

In the IC thus constituted, the first resistor in the first operating circuit and the second resistor in the protecting circuit normally work as biasing resistors which do not necessarily effect to increase the integration area, further, since these resistors are formed adjacently in the land of resistor forming region as the regions having different conductivity type from that of the resistor forming land, when the potential of the first resistor rises above the voltage of the resistor forming land by a value more than a predetermined value or drops below the voltage thereof by a value more than a predetermined value, the first resistor and the second resistor operate as the emitter or the collector regions of a transistor to perform the transistor operation, and the thus constituted transistor is turned ON when the base thereof receives the voltage depending on the voltage variation at the first terminal.

Therefore, this transistor operates such as for a conventional detection circuit and a detection transistor for detecting an over voltage, thereby, the conventional detection circuit including a comparator for an over voltage protection is eliminated.

Accordingly, the integration area for the over voltage protecting circuits is reduced and more integration area can be used for other functions required for the IC. As a result, an integration area for other functional circuits is increased, for example, many other detection circuits and protection circuits can be integrated, thereby, a further reliable IC can be realized.

BRIEF DESCRIPTION OF THE DRAWINGS

FIG. 2(a) is a plane view thereof and FIG. 2(b) is a cross sectional view taken along the line I—I in FIG. 2(a);

DESCRIPTION OF THE PREFERRED EMBODIMENTS

Figure 1:
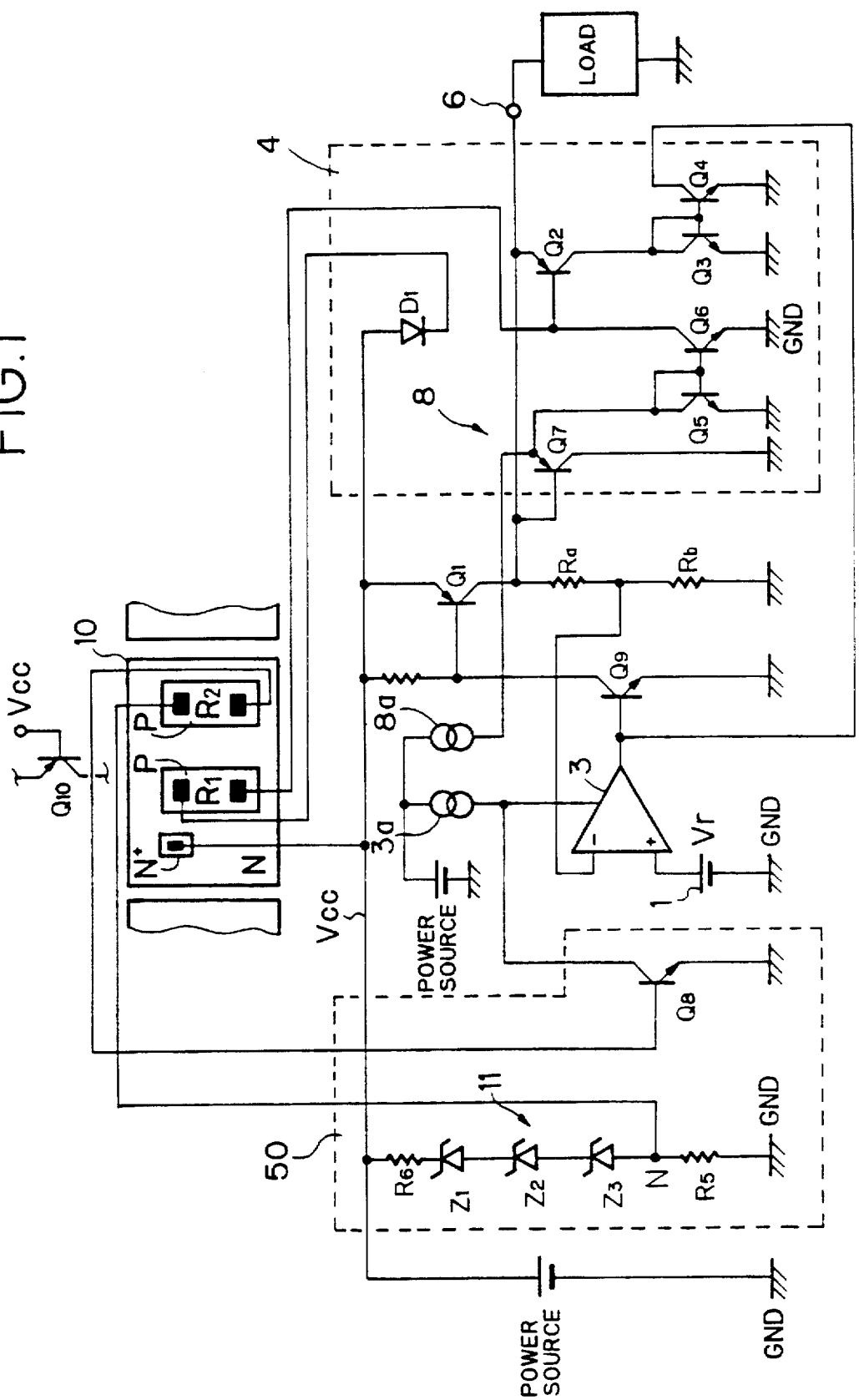
FIG. 1 is a block diagram of an embodiment of stabilizing power source circuits to which the present invention is applied.
Figure 4:
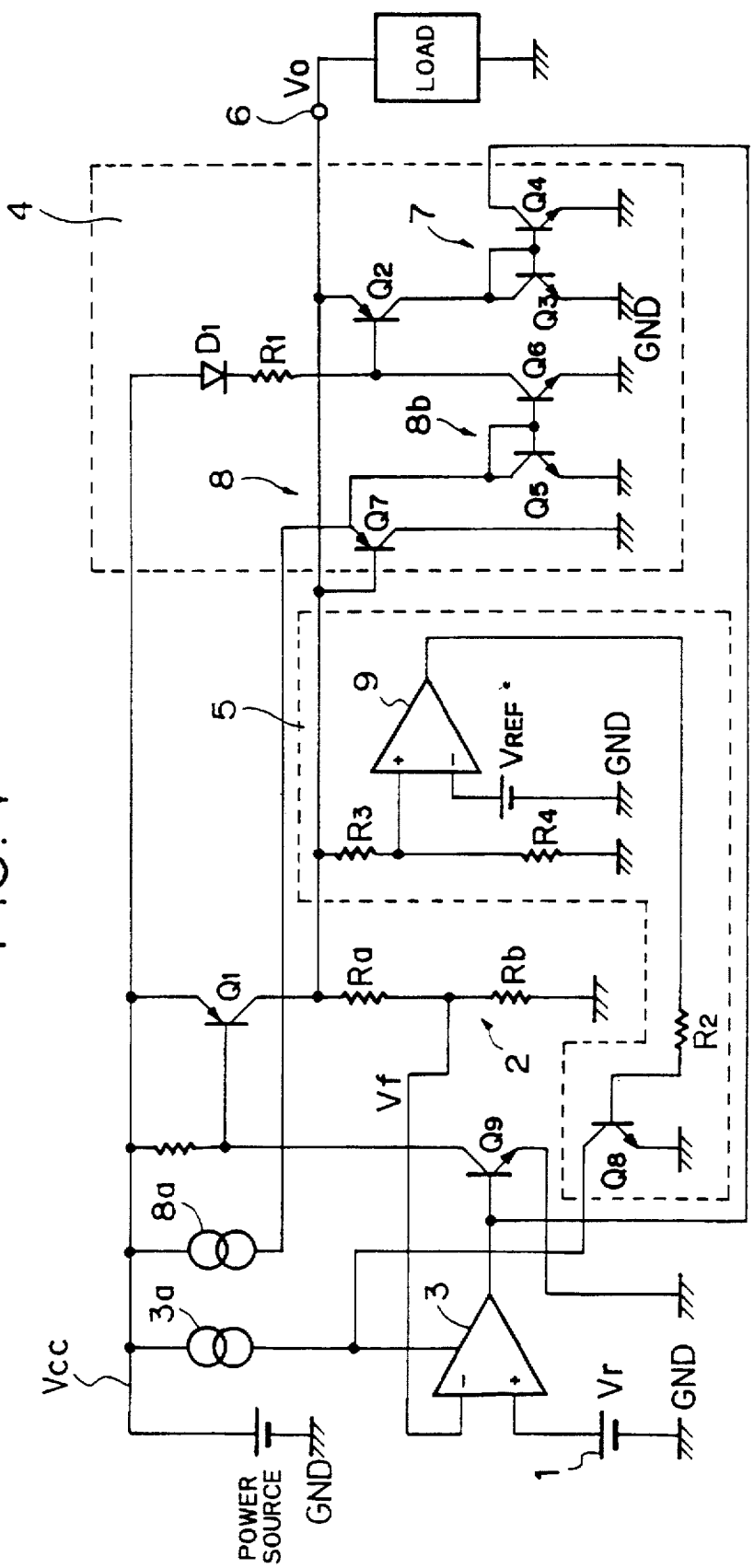
FIG. 4 is a block diagram of a conventional IC structured stabilizing power source circuit.

A difference of a stabilizing power source circuit as shown in FIG. 1 from the conventional stabilizing power source circuit as shown in FIG. 4 is that in place of the output over voltage protecting circuit 5 in FIG. 4 an over voltage protecting circuit 50 including a power source over voltage protecting circuit not shown in FIG. 4 is provided. Moreover, the over voltage protecting circuit 50 is realized by commonly using elements for its over voltage detection circuit portion with elements for the saturation preventing circuit 4. With this measure the integration area for the over voltage protecting circuit is further reduced. The common use of a part of the elements is achieved with regard to the biasing resistor R1 for the transistor Q2 in the saturation preventing circuit 4 and the biasing resistor R2 for the transistor Q8 as shown in FIG. 4 which are illustrated in the upper portion in FIG. 1, in which these resistors are formed adjacently within a device-isolated common resistor forming land 10. Further, these resistors are formed as regions having a different conductivty type (for example p type) from the conductivity type (for example N type) of the resistor forming land 10. Thereby, the resistor forming land 10 itself is utilized as a switching circuit which operates at the time of output over voltage. Accordingly, the circuit elements such as the comparator 9 and its biasing resistor as well as the dividing resistors R3 and R4 as shown in FIG. 4 are eliminated and the integration area for the over voltage protecting circuit is reduced.

Further, in the present embodiment a power source voltage detecting circuit 11 is provided for detecting an over voltage of the power source voltage Vcc. Namely, the over voltage of the power source voltage Vcc is detected by making use of emitter-collector of the transistor Q8 through connection of the base of the transistor Q8 with the power source voltage detection circuit 11 via the resistor R2.

The power source over voltage detection circuit is at first explained. The power source voltage detection circuit 11 is constituted by a resistor R6, three zenor diodes Z1, Z2 and Z3 and a resistor R5 which are successively connected between the power source line Vcc and the ground GND. The resistor R2 is connected to a junction point N between the zenor diode Z3 and the resistor R5 and a constant voltage drop from the power source voltage Vcc determined by the three zenor diodes Z1, Z2 and Z3 is generated at the junction point N.

With regard to the operation of the power source over voltage detection circuit, when the power source voltage Vcc rises from a voltage under a normal state the voltage at the junction point N rises. When the voltage at the junction point N rises and exceeds a voltage corresponding to 1Vf+a voltage drop across the resistor R2 (wherein 1Vf is a forward voltage drop between base and emitter of the transistor), the transistor Q8 is turned ON. When the transistor Q8 is turned ON, the output terminal of the current source 3a is grounded. Thereby, the operation of the error amplifying circuit 3 is stopped. The above is the over voltage detection of the power source voltage and the protection thereof.

The potential at the junction point N is lower than the power source voltage under a normal state by a voltage corresponding to a zenor voltage determined by the three zenor diodes and a voltage drop across the resistor R6, therefore, the potential at the junction point N is normally selected at a value lower than a voltage corresponding to 1Vf+a voltage drop across the resistor R2 with reference to the ground GND. When the power source voltage Vcc rises so as to increase the potential at the junction point N, the potential of the base of the transistor Q8 rises higher than the emitter thereof. As a result, the transistor Q8 is turned ON, which implies that the base and emitter of the transistor Q8 performs comparison and detection operations.

The over voltage detection at the output side (the load side) is now explained.

In the present embodiment, a part of the saturation preventing circuit 4 serves as the output over voltage protecting circuit. Namely, separate from the control range for the saturatin voltage, the circuit part receives a current from the transistor Q2 in the saturation preventing ciircuit 4 in response to the voltage rise at the output terminal 6 and turns ON the transistor Q8, thereby, the operation of the error amplifying circuit 3 is stopped, which is performed by the above resistor forming land 10. Namely, through the formation of the resistors R1 and R2 in the common resistor forming land 10 the land 10 is used as a transistor which switches this region.

The resistors R1 and R2 are formed in the common resistor forming land 10 and the region of the resistor forming land 10 is connected to the power source line Vcc. With these connections, when the output voltage Vo rises over the power source voltage Vcc by more than 2Vf (=2×1Vf), the base voltage of the transistor Q2 in the saturation preventing circuit 4 rises by more than 1Vf via a region 13 for the resistor R1 (see FIGS. 2(a) and 2(b)), and a transistor Q10 having the region 13 for the resistor R1 as the emitter, a region for the resistor R2 as the collector and the resistor forming land 10 as the base as illustrated by dotted lines (see FIGS. 2(a) and 2(b)) is turned ON. Thereby, a current flows from the resistor R1 toward the resitor R2.

As a result, a current flows from the output terminal 6 to the resistor R1 via the emitter and base of the transistor Q2 under ON state generated the rose output voltage, and a detection current flows into the base of the transistor Q8 via the transistor Q10 under ON state. With the detection current the transistor Q8 is turned ON and in the same manner as above the operation of the error amplifying circuit 3 is stopped.

The above function is realized by forming in an adjacent manner in the device-isolated resistor forming land 10 the biasing resistor R1 for the saturation preventing circuit 4 of which potential varies in response to the output voltage and the biasing resistor R2 for the transistor Q8 at the over voltage control side which operates when receiving the current from the resistor R1 as a detection signal. At this moment a transistor is formed between these two resistor regions 13 and 14 and the resistor forming land 10. The resistor forming land 10 itself is used as the base in the thus formed transistor and the potential of the resistor forming land 10 serving as the base is set at the power source voltage Vcc (also possible to be set at a constant reference voltage).

Thereby, when the potential at the output side exceeds the power source voltage Vcc (or the constant reference voltage) by more than 2Vf, the transistor Q10 is turned ON by the current fed via the transistor Q2 under ON state. Namely, the transistor Q10 is operated to serve as a switch transistor for the over voltage detection at the output side.

As will be understood from the above, when a transistor is constituted by forming the biasing resistors R1 and R2 for the respective protecting circuits in the common resistor forming land instead of forming the same in separate lands as usual, such as the comparator 9 and the resistors R3 and R4 for the over voltage detection at the load side as shown in FIG. 4 are eliminated. Of course, the comparator which had to be provided for detecting an over voltage of the power source itself is also unnecessitated herein as explained previously. Further, the newly provided power source voltage detection circuit 11 is equivalent in its circuit scale as with the comparison reference power source $V_{REF}$ in the comparator 9, therefore, the integration area increase in the IC by adding the power source voltage detection circuit 11 is substantially canceled out by the elimination of the comparison reference power source $V_{REF}$.

Figure 2A:
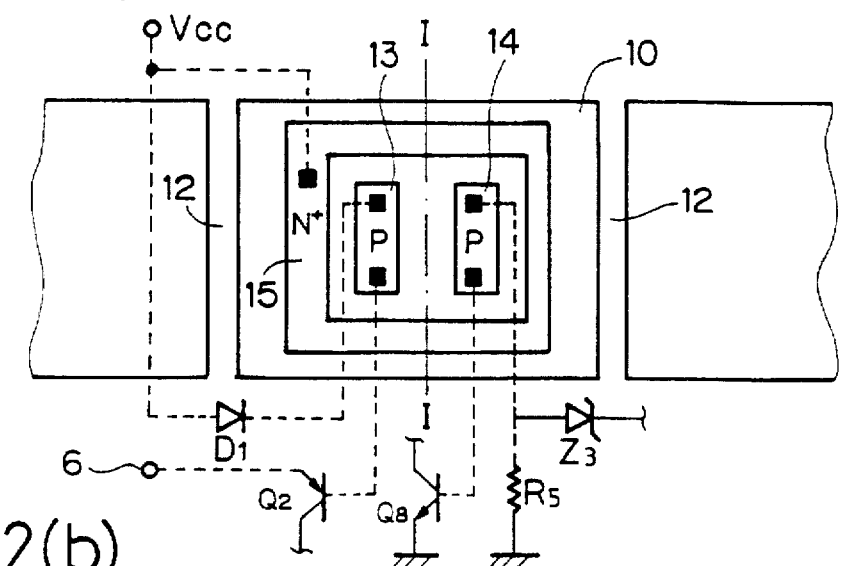
FIGS. 2(a) and 2(b) are views for explaining a resistor forming land.

Now, the transistor Q10 is explained in more detail with reference to FIGS. 2(a) and 2(b). The resistor forming land 10 for the resistor forming region is device-isolated and is specifically provided as the region for forming the resistors R1 and R2. FIG. 2(a) illustrates a plane view of the resistor forming land 10 and FIG. 2(b) illustrates a cross sectional view taken along the line I—I in FIG. 2(a).

Figure 2B:
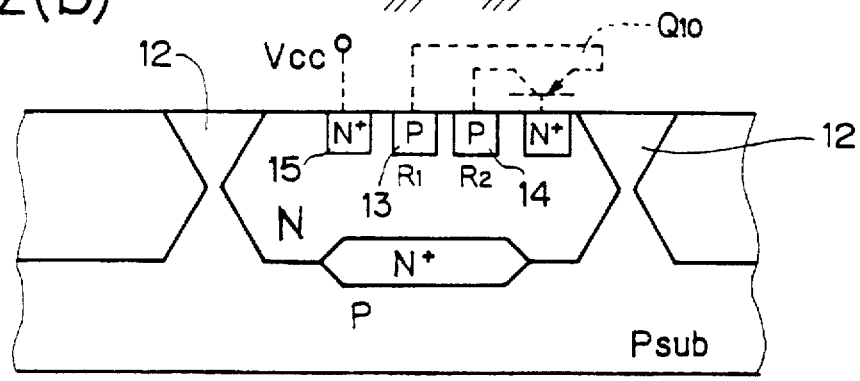

As seen from FIGS. 2(a) and 2(b), in the region device-isolated via an isolation layer 12 in the P type substrate Psub P type resistor forming layers 13 and 14 are provided. Among these P type layers the layer 13 is assigned for the resistor R1 and the layer 14 for the resistor R2. An N+ layer 15 which is formed adjacent the P type layer 13 is a contact region for the resistor forming land 10 and is connected to the power source line Vcc. Thereby, when the potential of the P type layer 13 rises over the power source voltage Vcc by 1Vf, these regions are operated as the transistor Q10 and constitute a switch circuit which is turned ON when a potential difference between the base and emitter of the transistor exceeds 1Vf.

Figure 3:
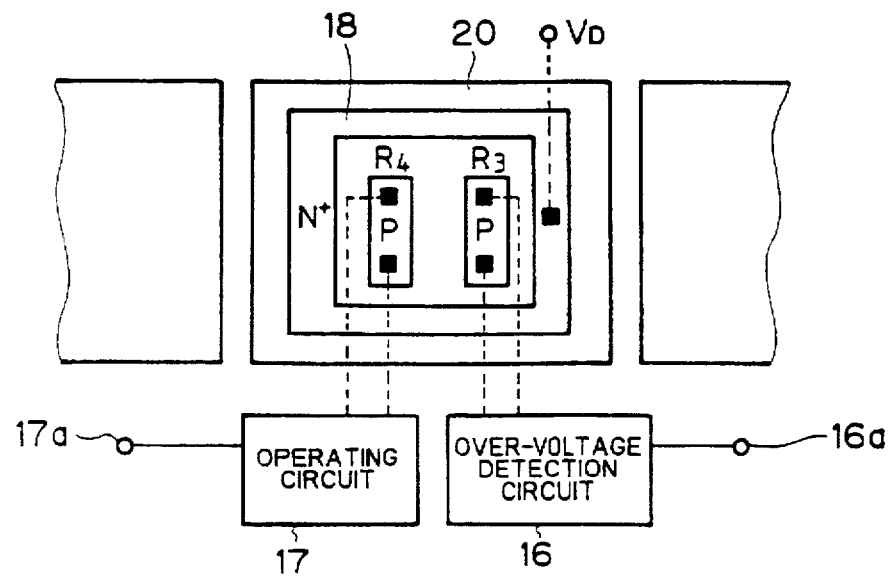
FIG. 3 is a basic constitutional diagram of an over voltage protecting circuit according to the present invention.

FIG. 3 is a basic constitutional diagram of a more general over voltage protecting circuit and is illustrated in a plane view in a manner to correspond to FIG. 2(a). Numeral 16 is an over voltage detection circuit which generates a control signal when an over voltage is detected, a resistor R3 (which corresponds to the resistor R2 in the previous embodiment) inserted at the detection terminal thereof is formed in a device-isolated resistor forming land 20 and a resistor R4 (which corresponds to the resistor R1 in the previous embodiment) at the side of a terminal 17a for an over voltage detection, for an operating circuit 17 of which potential rises correspondingly is also formed in the resistor forming land 20 adjacent to the resistor R3. Numeral 18 is a contact region for the resistor forming region.

With the above structure, like the previous embodiment when the potential at the side of the terminal 17a rises and assumes a predetermined value exceeding the voltage $V_D$ of the resistor forming land 20 by more than 1Vf, the resistor forming land 20 operates as a transistor to turn ON the same, thereby a detection current flows from the resistor R4 to the resistor R3 to operate the power source over voltage protecting circuit 16 and to generate a control signal at a control terminal 16a in response to the over voltage detection.

As will be understood from the above and from the embodiment shown in FIG. 3, the present invention can be applied not only for the stabilizing power source circuit but also for an over voltage protecting circuit for several types of IC structured circuits.

Further, the term "over voltage" includes an instance wherein the potential of the resistor forming land drops relatively with respect to the potential at the output terminal or the first terminal. In such instance, when assuming that the resistor forming land 20 as the base, the type of the transistor Q10 is modified from PNP type in the previous embodiment to NPN type and the resistor R4 for the operating circuit 17 is determined as the emitter thereof.

We claim:

1. An IC having a built-in over voltage protecting circuit comprising:

a first operating circuit having a first resistor connected to a terminal a voltage of which varies depending on a voltage at a first terminal;

a second operating circuit;

a protecting circuit having a second resistor, which receives a detection signal via said second resistor and controls the operation of said second operating circuit therewith to thereby protect the operation of said second operating circuit, wherein said first resistor and said second resistor are formed adjacently in a device-isolated common resistor forming land as regions having different conductivity type from that of the resistor forming land, the potential of the resistor forming land is set at a predetermined voltage which is different from the voltage at said first terminal, and the detection signal is generated, when a transistor which is composed by said first resistor, said second resistor and the resistor forming land is turned ON in response to a variation of the voltage at said first terminal by a value more than a predetermined value.

2. An IC having a built-in over voltage protecting circuit according to claim 1, wherein the potential of said resistor forming land is set at either a power source voltage or a higher potential than the voltage at said first terminal and when the potential at said first terminal rises over the potential of said resistor forming land by more than a predetermined value, said transistor is turned ON.

3. An IC having a built-in over voltage protecting circuit according to claim 1, wherein the potential of said resistor forming land is set at either a power source voltage or a lower potential than the voltage at said first terminal and when the potential at said first terminal drops below the potential of said resistor forming land by more than a predetermined value, said transistor is turned ON.

4. An IC having a built-in over voltage protecting circuit according to claim 2, wherein said first terminal is a terminal at which an output transistor outputs a power having an output voltage for a stabilizing power source circuit, said first operating circuit is a saturation preventing circuit for said output transistor, said second operating circuit has said output transistor and an error amplifying circuit which compares the potential at said first terminal or a divided potential thereof with a reference voltage and generates an error signal for stabilizing the output voltage and said protecting circuit has a switch circuit for stopping the operation of said error amplifying circuit.

5. An IC having a built-in over voltage protecting circuit according to claim 4, further comprising a power source voltage detecting circuit which receives the power source voltage from a power source line in said stabilizing power source circuit and generates a predetermined detection voltage according to the received power source voltage, said saturation preventing circuit includes a first transistor which is connected to said first terminal and, when a voltage between the potential at said first terminal and the power source voltage decrease less than a predetermined value, is turned ON to perform a control for preventing saturation of said output transistor, and said switch circuit includes a second transistor and when the detection voltage assumes more than the predetermined value, the second transistor is turned ON to stop the operation of said error amplifying circuit.

6. An IC having a built-in over voltage protecting circuit according to claim 5, wherein said first resistor is a biasing resistor for the base of said first transistor, said second resistor is a resistor provided between said power source voltage detecting circuit and the base of said second transistor, the detection voltage is applied to the base of said second transistor via said second resistor and said resistor forming land is connected to the power source line.

7. An IC having a built-in over voltage protecting circuit according to claim 6, wherein said resistor forming land is an N type region formed in a P type substrate, said first and second resistors are formed adjacently as P type regions, said first transistor is a PNP type transistor of which the emitter is connected to said first terminal and said second transistor is an NPN transistor which sinks a current of a current source for generating an operating current for said error amplifying circuit to the ground.

8. An IC having a built-in over voltage protecting circuit according to claim 7, wherein said saturation protecting circuit is a circuit which prevents saturation of said output transistor by sinking the output of said error amplifying circuit depending on the current when said transistor is turned ON, and when the power source voltage is in a normal condition, the detection voltage is set at a lower voltage than a voltage corresponding to a forward voltage between the base and emitter of said transistor plus a voltage drop of said second resistor.

* * * * *